United States Patent

[11] 3,614,478

[72] Inventor Peter Schiff
R. D. # 2, Lambertville, N.J. 08530

[21] Appl. No. 845,998
[22] Filed July 30, 1969
[45] Patented Oct. 19, 1971

[54] HIGHLY SELECTIVE FILTER CIRCUIT
12 Claims, 4 Drawing Figs.

[52] U.S. Cl. .......... 307/295, 330/30 D, 330/17, 330/26, 328/167, 307/313
[51] Int. Cl. .......... H03k 1/16, H03f 3/68, H03k 3/72
[50] Field of Search .......... 330/99, 185, 192, 184, 152, 94; 307/295; 328/165

[56] References Cited

UNITED STATES PATENTS

| | | | |
|---|---|---|---|
| 2,137,419 | 11/1938 | Shepard, Jr. | 330/152 X |
| 2,584,386 | 2/1952 | Hare | 330/99 |
| 3,317,851 | 5/1967 | Julie | 330/99 X |
| 3,473,141 | 10/1969 | Fjallbrant | 330/94 |

*Primary Examiner*—Nathan Kaufman
*Attorney*—Ostrolenk, Faber, Gerb & Soffen

ABSTRACT: A filter circuit providing extremely sharp attenuation at a selected frequency cutoff point. The sharp attenuation is obtained through the use of several ganged or cascaded active filter sections whose characteristics are combined in an additive fashion to provide an extremely flat passband characteristic and a sharp attenuation curve at the desired frequency cutoff value.

Filter circuits of this design may be used in combination in the electrocardiograph field to isolate the R-wave of the PQRS complex of an electrocardiogram resulting in trigger signals of a high degree of accuracy for purposes of R-wave detection and evaluation.

PETER SCHIFF
INVENTOR.

BY

OSTROLENK, FABER, GERB & SOFFEN
ATTORNEYS

PETER SCHIFF
INVENTOR.

BY
OSTROLENK, FABER, GERB & SOFFEN
ATTORNEYS

HIGHLY SELECTIVE FILTER CIRCUIT

The present invention relates to electronic filters, and more particularly to an electronic filter circuit comprised of cascaded filter sections combined in such a way as to provide an extremely flat passband characteristic and extremely high attenuation at the predetermined frequency cutoff value.

In many electronic applications, it is desirable and quite often necessary to provide a frequency selective circuit in which the gain of the amplifier decreases rapidly below a predetermined low-frequency value or above a predetermined high-frequency value. The amplifier response in the passband above the low-frequency cutoff point and below the high-frequency cutoff must remain completely flat. The present invention is characterized by providing a frequency selective circuit having extremely sharp low-and high-frequency cutoff points and an extremely flat passband. The circuit is comparatively simpler than any other conventional circuits, and its performance characteristics are such as to lend itself ideally for isolation and detection of selected portions of PQRS waves of an electrocardiogram for synchronization or other purposes.

Circuits of this nature have conventionally been obtained through the use of several ganged capacitive filter sections in an active filter. The ganged capacitive filter sections result in amplitude variations within the passband of the circuit so as to severely limit the performance of the ganged capacitor sections in an active filter circuit. The present invention provides a filter circuit in which several filter elements are combined in a unique fashion to provide a completely flat passband and extremely sharp attenuation curves in the cutoff region, which advantages are gained through a rather simplified design.

Frequency selective filters are typically categorized as the conventional inductor-capacitor type or the active filter type wherein the latter category utilizes only capacitive elements to achieve low- and high-frequency cutoff attenuation curves in combination with electronic circuitry. The active filter type of device has inherent advantages due to its small physical size, flexibility and greatly improved performance. The rate of amplitude falloff with increasing or decreasing frequency in such active filters is determined by the number of filter elements or capacitors in an active filter configuration. It is desirable to have this change in amplitude with change in frequency to be as large as possible while maintaining a completely flat response within the passband. Up to the present time, such systems were capable of being devised by the use of extremely complex capacitor-resistor networks which do not provide flat response within the passband of the filter, but provided for the possibility of combining several capacitor-filter elements to provide very sharp cutoff points at the high- or low-frequency design points of the filter circuit.

A simplified scheme in which either series capacitor-shunt resistor networks are series connected for low-frequency cutoff points or wherein series resistor-shunt capacitor networks are series connected for high-frequency cutoff points results in one of the following two conditions:

When the RC sections are connected in series in an amplifier provided with feedback to maintain uniform passband response, the phase shift within the RC sections results in oscillatory conditions when more than one capacitor section is included within a single amplifier response loop.

In cases where each amplifier section is permitted only a single capacitor element, the attenuation slopes of all the sections are additive, and a sharp cutoff response is obtained. However, in the area between the passband and the cutoff band, the relatively poorly defined drip in amplitude is additive, and as such, it makes for a very rounded and undesirable type of response.

In accordance with the present invention, a filter circuit is disclosed which will permit the combination of several capacitor-resistor sections within a single amplifier module having negative feedback to provide a flat passband characteristic and a sharp attenuation curve when several of these multiple RC element sections are combined. This design scheme greatly simplifies both the construction and the operation of an active filter element.

In the case of a high-frequency cutoff active filter circuit, first and second series resistor-shunt capacitor sections are connected in series in combination with electronic circuitry including a feedback loop. Since the pair of filter sections can provide a phase shift of as much as 180° (due to their additive characteristics) attenuation means is provided in the feedback loop to prevent an oscillating condition. The high-frequency cutoff, while being rather steep, nevertheless generates increased amplitude response in the region immediately prior to the high-frequency cutoff point. For this reason, a second filter section of the series resistor-shunt capacitor type is provided in conjunction with electronic circuitry having a negative feedback loop and is connected in cascade with the first multiple filter section. Since this latter section generates a dropoff in amplitude well prior to the high-frequency cutoff point and a substantially slower rate of decrease of amplitude with increasing frequency, the additive effect of the cascaded filter sections yield a composite frequency response curve which has extremely flat response through the passband and drops off at an attenuation rate or slope of 60 db. per decade at the high-frequency cutoff point.

In application wherein it is desired to provide an active filter circuit for obtaining low-frequency cutoff, a similar design technique is employed in conjunction with series capacitor-shunt resistor filter circuits.

The novel active filters described hereinabove may be used to great advantage in circuits employed for analyzing and synchronizing the PQRS complex of an electrocardiogram. The electrocardiogram signals are taken from different points on the body of a patient and connected through suitable electrodes to a differential amplifier circuit which may, for example, be of the type described in copending application Ser. No. 839,888, filed July 8, 1969. The detected signals are passed through a high-frequency rejection filter to eliminate all signals including electrical noise above a predetermined frequency level. A 60-cycle rejection filter is then provided in cascade with the high-frequency rejection filter to remove any power line interference, and thereby improve the overall performance of the filter circuit. The detected signals are then passed through a low-frequency rejection filter which isolates any signals below a lower predetermined frequency value so as to isolate any neuromuscular or electrode-induced electrolytic potential change appearing in the electrocardiogram. The resultant signal is then coupled to a trigger circuit which generates a trigger pulse of unprecedented accuracy representing the occurrence of an R-wave within the PQRS complex of the electrocardiogram, which signal may then be used for evaluation and analysis purposes and further for synchronization of other equipment such as, for example, mechanical ventricular assistance pumping equipment which may then be caused to operate in synchronism with the heart beat to provide a highly desirable assistive mechanical pumping action. One such system is described in copending application Ser. No. 789,551, filed Jan. 7, 1969.

It is, therefore, one object of the present invention to provide a novel active filter circuit having an extremely flat response within the passband and a sharp drop off at the desired frequency cutoff value.

Another object of the present invention is to provide a novel active filter circuit having an extremely flat response within the passband and providing extremely sharp drop off at a predetermined high-frequency value.

A further object of the present invention is to provide a novel active filter circuit having an extremely flat response within the passband and providing extremely sharp drop off at a predetermined low-frequency value.

Still another object of the present invention is to provide a novel filter circuit employing multiple resistor-capacitor sections connected in series with at least one single resistor-capacitor section wherein each section is further combined with electronic circuitry having a negative feedback loop to provide the desired sharp cutoff at the cutoff frequency value.

Yet another object of the present invention is to provide a novel circuit for detecting a portion of a signal within a complex waveform through the use of high-frequency and low-frequency rejection filters connected in cascade, which filters provide extremely flat response within their respective passbands and further provide extremely sharp cutoff at their respective high- and low-frequency cutoff points so as to enable detection of only that portion of a complex signal waveform which is required for evaluation and/or synchronization purposes.

These as well as other objects of the present invention will become apparent when reading the accompanying description and drawings in which.

Figure 1:
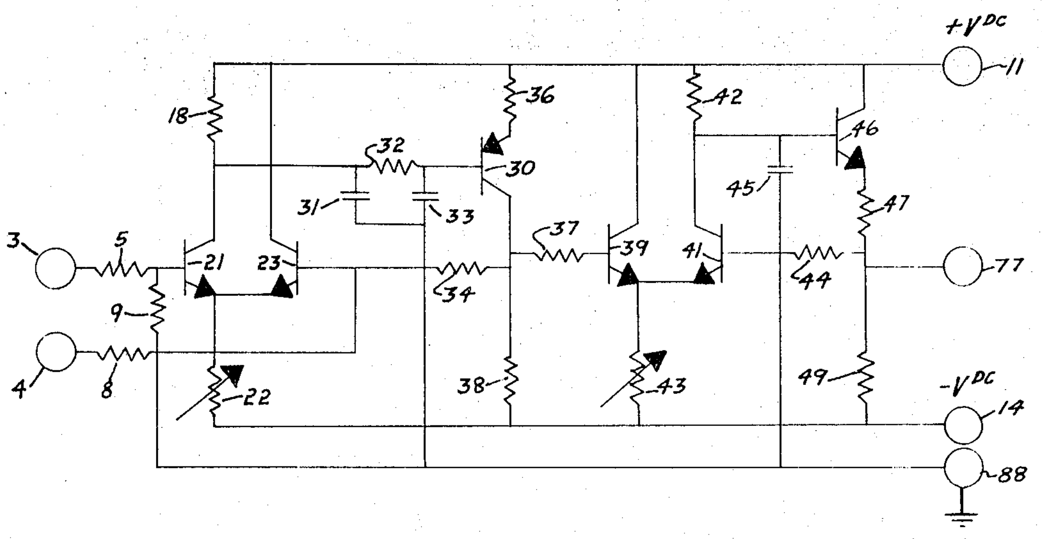
FIG. 1 is a schematic diagram showing a high-frequency rejection filter designed in accordance with the principles of the present invention.

FIG. 1 is a circuit diagram showing a high-frequency elimination filter circuit. The circuit of FIG. 1 comprises an input terminal 3 which is connected through resistor 5 to the base of an NPN transistor 21. The base of transistor 21 is also connected to ground reference 88 through resistor 9. Positive and negative supply voltage terminals 11 and 14 provide power for the circuit. The inverting input terminal 4 of the amplifier is connected through resistor 8 to the base of NPN transistor 23. The collector electrode of transistor 23 is connected to terminal 11. The collector of transistor 21 is connected to terminal 11 through resistor 18 and is further connected to terminal 88 through capacitor 31 and still further is connected to the base of PNP transistor 30 through resistor 32. The emitter of transistor 21 is connected in common with the emitter of transistor 23, which common terminal is connected to the negative supply terminal 14 through adjustable resistor 22.

The emitter of transistor 30 is connected to terminal 11 through resistor 36, while the collector of transistor 30 is connected to the base of transistor 23 through resistor 34, to terminal 14 through resistor 38 and to the base of NPN transistor 39 through resistor 37. The emitter of transistor 39 is connected in common with the emitter of NPN transistor 41, which common terminal is connected to negative supply terminal 14 through adjustable resistor 43. The collector of transistor 41 is connected to positive supply terminal 11 through resistor 42, to the base of NPN transistor 46 and to ground reference terminal 88 through capacitor 45. The collector of transistor 46 is directly connected to positive supply terminal 11, while its emitter is connected through series coupled resistors 47 and 49 to terminal 14. The common junction of resistors 47 and 49 is connected to the base of transistor 41 through resistor 44. The output of the circuit is taken from the common terminal between resistors 44, 47 and 49 and appears at output terminal 77. Suitable positive and negative voltage sources are connected to terminals 11 and 14, respectively.

The circuit of FIG. 1 comprises two separate high-frequency cutoff filter sections. The first section is comprised of transistors 21, 23 and 30, while the second section comprises transistors 39, 41 and 46. In the first section, capacitor 31 shunts the collector resistor 18 and the very high output impedance of the collector of transistor 21. Capacitor 33 shunts the resistor 32. As such, capacitors 31 and 33 act as a double high-frequency filter section yielding an amplitude attenuation of 40 db. per decade in the region of the high-frequency cutoff value. A signal applied to input terminal 3 is amplified by transistor 21 with an out-of-phase signal applies to terminal 4 is amplified by transistor 23 (which forms the differential transistor pair composed of transistors 21 and 23) in an inphase mode. Capacitors 31 and 33 shunt the output of transistor 21 and couple the attenuated signal to the base of transistor 30. The amplification of transistor 30 is limited by resistor 36. The feedback from the collector of transistor 30 is coupled to the inverted input at the base of transistor 23. Potentiometer 22 is adjustable so as to obtain zero offset voltage between terminal 3 or terminal 4 and the output of the first section appearing at the collector of transistor 30.

Figure 2:
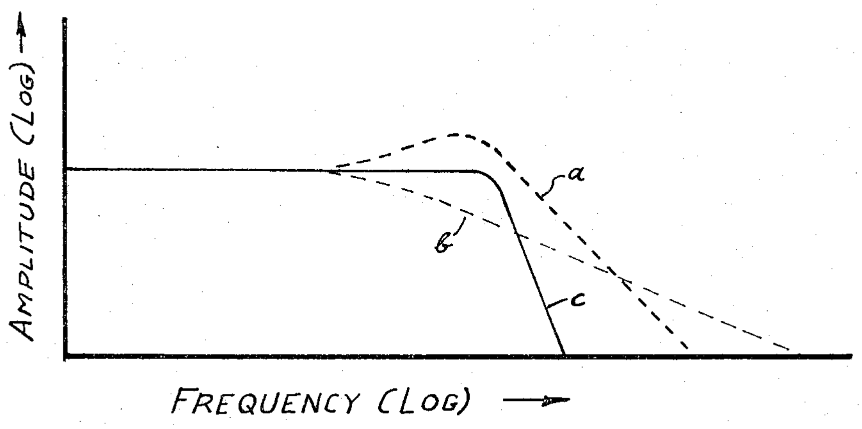
FIG. 2 shows a plurality of waveforms useful in describing the operation of the circuit of FIG. 1.

The response of the first filter section of FIG. 1 is shown by curve *a* of FIG. 2. The filter capacitors 31 and 33 cause a sharp decrease in gain at the high-frequency extremity. Since a maximum phase shift of up to 90° may be obtained from each capacitor section and since the phase shift of the sections are additive, a phase shift of up to 180° is possible in such a circuit. Thus, the feedback provided by resistor 34 from the output of the amplifier section (i.e. transistor 30) to the inverting input will be in-phase at this frequency shift point and an oscillating condition will occur. To avoid this undesirable condition, the value of resistor 36 is selected so as to limit the gain of the amplifier short of an oscillatory condition. As such, a slight increase in the filter circuit amplitude response is obtained just below the frequency cutoff point of the filter section, as depicted by curve *a* of FIG. 2.

The second filter section which includes transistors 39, 41 and 46 is a high-frequency cutoff section in which capacitor 45 shunts the collector resistor 42 and the very high collector impedance of transistor 41. Negative feedback from the output terminal 77 is provided through resistor 44 to obtain a limited frequency amplification in the passband. Resistor 43 is adjustable in order to permit for adjustment of zero offset voltage between the input of the second filter stage (i.e. the base of transistor 39) and the output of this stage appearing at terminal 77. Resistor 47 allows for the offset voltage between the base and collector of transistor 41. The maximum phase shift for the single capacitor filter is 90°, and as such, falls short of developing any oscillatory condition. The response of this filter section is depicted by curve *b* of FIG. 2.

Since both filter sections and their amplitude characteristics, as shown by curves *a* and *b* of FIG. 2, are in series (i.e. are connected in cascade), their responses are additive. As such, the peaking and gain of the first section composed of transistors 21, 23 and 30 is added to the sluggish drop off in response of the second section composed of transistors 39, 41 and 46. The additive frequency response characteristics of the two sections result in the idealized curve *c* of FIG. 2. In this manner, attenuation curves having a dropoff of 60 db. per decade are obtained by simply series-connecting two amplifier modules having two and one filter section, respectively.

Figure 3:
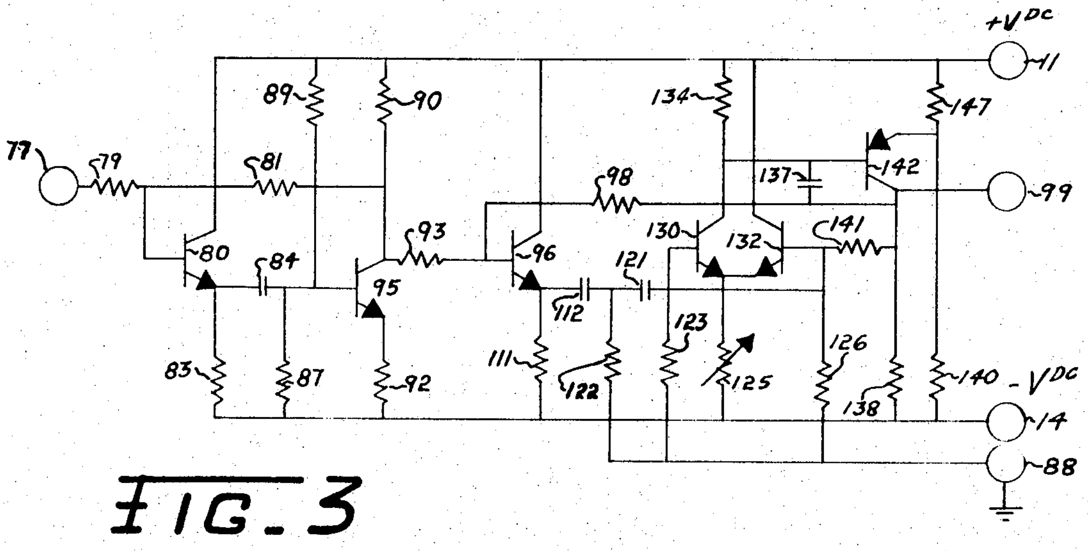
FIG. 3 is a circuit diagram showing a low-frequency rejection filter circuit designed in accordance with the principles of the present invention.

FIG. 3 shows a circuit diagram of a low-frequency cutoff filter employing basically the same design concepts. Input terminal 77 is connected through resistor 79 to the base of NPN transistor 80. The collector of transistor 80 is connected to the positive supply voltage terminal 11. The emitter of transistor 80 is connected through resistor 83 to negative supply terminal 14 and through capacitor 84 to the base of NPN transistor 95 is connected through resistor 89 to terminal 11 and through resistor 87 to terminal 14. The collector of transistor 95 is connected through resistor 90 to terminal 11; through resistor 81 to the base of transistor 80; and through transistor 93 to the base of NPN transistor 96. The emitter of transistor 95 is connected to terminal 14 through resistor 92. The collector of transistor 96 is directly connected to terminal 11 and its emitter is connected to terminal 14 through resistor 111 and to the base of NPN transistor 132 through series-connected capacitors 112 and 121. The common junction of capacitors 112 and 121 is connected through resistor 122 to ground reference terminal 88. The base of transistor 132 is connected to terminal 88 through resistor 126. The collector of transistor 132 is directly connected to terminal 11 and its emitter is connected in common with the emitter of transistor 130, which common junction is connected to terminal 14 through adjustable resistor 125. The collector of transistor 130 is connected to terminal 11 through resistor 134, and is further connected to the base of PNP transistor 142. The base of transistor 130 is connected through resistor 123 to ground reference terminal 88. The emitter of transistor 142 is connected through resistor 147 to terminal 11 and through resistor 140 to terminal 14. The collector of transistor 142 is connected directly to output terminal 99; is connected to terminal 14 through resistor 138; is connected to the base of transistor 96 through resistor 98; and is connected to the base of transistor 132 through resistor 141.

The low frequency rejection filter of FIG. 3 is composed of two sections, namely a single capacitor filter section having an attenuation of 20 db. per decade which includes transistors 80 and 95, and a double section filter having a 40 db. per decade dropoff which is comprised of transistors 96, 130, 132 and 142. The first section exhibits a condition well short of oscillation, while the second section will have a peaked characteristic just above its low-frequency cutoff point in much the same manner as the filter circuit of FIG. 1. When the two sections are combined in the manner shown in FIG. 3, a flat passband amplifier characteristic is obtained with an excellent sharp cutoff point and a slope of 60 db. per decade at the low-frequency cutoff value. Potentiometer 125 is adjustable to obtain zero offset voltage at output terminal 99. Capacitor 137, connected between the collector and base electrodes of transistor 142, restricts the undesirable high-frequency oscillations of the second filter section and thereby aids in stabilization of the circuit. Resistors 147 and 140 degenerate PNP transistor 142 to limit the peaked gain response of the second dual filter section short of oscillation. Resistor 141 limits the amplification of the second dual filter section within the passband as does resistor 98. Transistor 96 provides a low-impedance signal to series connected capacitor elements 112 and 121 due to its low output impedance characteristics (transistor 96 being connected in emitter follower fashion). The first single filter section also includes an emitter follower connected transistor 80 to provide a low-impedance signal to filter capacitor 84. As can clearly be seen, the filter sections of FIG. 3 are comprised of series capacitor-shunt resistor elements as compared with the high-frequency rejection filter circuit of FIG. 1 which is comprised of series resistor-shunt capacitor filter sections.

Figure 4:
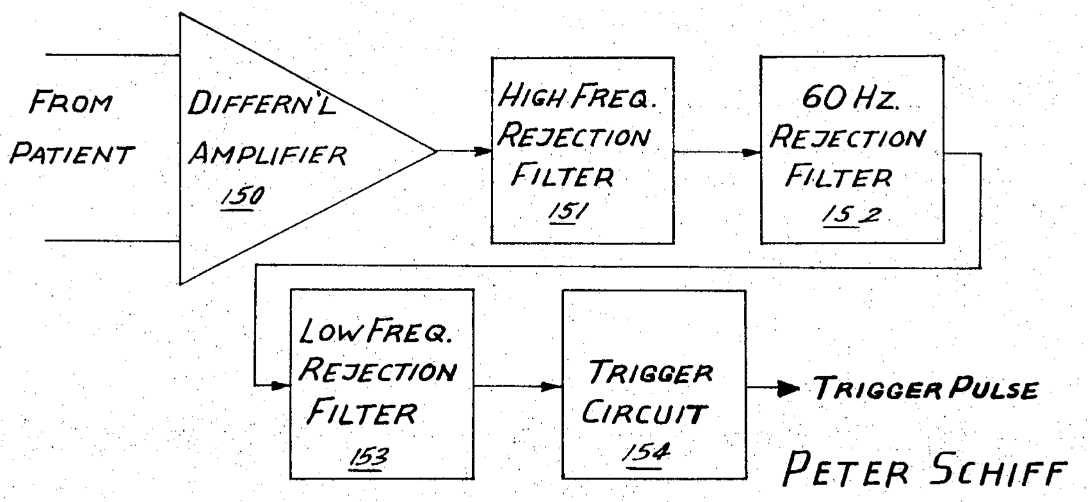
FIG. 4 is a block diagram showing a detection circuit employing filter circuits of the types shown in FIGS. 1 and 3 for detecting only a desired portion of a complex waveform for evaluation and or synchronization purposes.

The characteristics of the low-frequency cutoff filter of FIG. 3 and the high-frequency cutoff filter of FIG. 1 make these circuits extremely advantageous for use in the detection of the PQRS complex of the electrocardiogram, especially for the purpose of accurately detecting the presence of the R-wave within the PQRS complex of the electrocardiogram. A suitable circuit for R-wave detection is shown in FIG. 4. A patient (not shown) is connected through suitable electrodes (not shown) to a differential amplifier 150 which detects the minute differential signal between two points on the body of the patient. The output signal is passed through a high-frequency rejection filter 151 to isolate any electrical noise above the 15 to 30 cycle per second frequency characteristic of the R-wave. The signal passed by filter 151 is applied to a 60-cycle rejection filter which removes any power line interference from the signal being examined so as to aid in the overall performance of the composite filter circuit. The operation of filter 152 is such as to remove a 60-cycle component from the signal. The output of filter 152 is coupled to the input of a low-frequency rejection filter 153 for the purpose of isolating any neuromuscular or electrolytic potential change in the electrocardiogram. Filter 153 thereby causes any components in the signal below 15 cycles to be rejected (i.e. to be eliminated from the detected signal). The signal is fed into a symmetrical positive/negative trigger circuit 154 for generating a trigger pulse of unprecedented accuracy to obtain detection of the electrocardiogram R wave as well as obtaining extremely high noise rejection. The trigger pulse output of the trigger circuit may be employed for evaluation and/or synchronization purposes. For example, the trigger pulse output may be utilized to control the operation of mechanical assistive heart pumping devices of the type described in copending application Ser. No. 788,551, filed Jan. 7, 1969. This enables highly accurate synchronization of the mechanical assistive pumping action in conjunction with the heart beat or rhythm of the subject.

It can, therefore, be seen from the foregoing description that the present invention provides filter circuits having extremely flat passband characteristics and a very abrupt amplitude dropoff at the frequency cutoff point, which circuits are extremely advantageous for use in detection of a particular component within a complex waveform through an elimination or severe attenuation of all signals whose frequencies lie either above or below the desired signal component.

Although this invention has been described with respect to particular embodiments, it should be understood that many variations and modifications will now be obvious to those skilled in the art, and, therefore, the scope of this invention is limited not by the specific disclosure herein, but only by the appended claims.

The embodiments of the invention in which an exclusive privilege or property is claimed are defined as follows:

1. A filter circuit having an extremely flat passband and abrupt cutoff at a predetermined cutoff frequency comprising:
- first and second series-connected filter stages;
- said first filter stage comprising:
- first and second resistor-capacitor filter sections connected in series;
- a first amplifier connected to the output of said first filter stage;
- differential amplifier means having first and second input terminals and an output;
- said differential amplifier means output being coupled to said first filter section, and said first input receiving incoming signals;
- a first feedback path comprising impedance means connected between the output of said first amplifier and the second input of said differential amplifier means;
- said second filter stage comprising:
- a third resistor-capacitor filter section;
- a second amplifier connected to the output of said third filter section, said second amplifier having an output for developing the output signal;
- a second feedback path connected between the output of said second amplifier and the input of said third filter section.

2. The filter circuit of claim 1 wherein said first, second and third resistor capacitor filter sections are of the series capacitor-shunt resistor type.

3. The filter circuit of claim 2 further comprising an emitter follower circuit having an output coupled to the input of said third resistor-capacitor filter section and having an input coupled to said second feedback path and the second resistor-capacitor filter section.

4. The filter circuit of claim 3 further comprising
- a differential amplifier means comprised of first and second transistors each having base, emitter and collector electrodes;
- the emitter electrodes of said first and second transistors being connected in common;
- the base electrode of one of said transistors being connected to the output of said second resistor-capacitor filter section, and being connected to said second feedback path;
- the base electrode of the remaining one of said transistors being coupled to ground;
- the collector of the remaining one of said first and second transistors being connected to the input of said second amplifier.

5. The filter circuit of claim 4 wherein said first amplifier further means for preventing oscillation of said filter circuit.

6. The filter circuit of claim 1 wherein said first feedback path impedance means includes attenuation means for attenuating the portion of the output signal fed back to the input of the first resistor-capacitor filter section by an amount sufficient to prevent oscillation.

7. The filter circuit of claim 1 wherein said differential amplifier means comprises first and second transistors having base, emitter and collector electrodes; the emitter electrodes being connected in common;

the base electrode of said first differential amplifier first transistor being the input of the filter circuit;

the collector of said first differential amplifier first transistor connected to the input of said first resistor-capacitor filter section;

the base electrode of said first differential amplifier second transistor connected to said first feedback path.

8. The filter circuit of claim 7 further comprising second differential amplifier amplifier means;

said second differential amplifier means comprises first and second transistors having base, emitter and collector electrodes; the emitter electrodes being connected in common;

the base electrode of said second differential amplifier first transistor connected to the output of said first amplifier;

the collector of said second differential amplifier second transistor connected to the input of said second resistor-capacitor filter section;

the base electrode of said second differential amplifier second transistor connected to said second feedback path.

9. A circuit for generating a trigger signal representing the presence of a particular signal component contained within a complex electrical waveform comprising an input for receiving said electrical waveform;

a first filter circuit for rejecting signals of a frequency above a first frequency cutoff point being connected to said input terminal;

a second filter circuit connected to said first filter circuit for rejecting signals of a frequency below a second frequency cutoff point which is lower than said high-frequency cutoff point;

a trigger circuit connected to said second filter circuit for generating a trigger pulse each time a signal lying within the passband between said low- and high-frequency cutoff points is applied to said input terminal;

at least one of said first and second filter circuits being of the type described in claim 1.

10. The circuit of claim 9 wherein the first, second and third resistor-capacitor filter sections of said first filter circuit are of the series resistor-shunt capacitor type.

11. The circuit of claim 10 wherein the first, second and third resistor-capacitor filter sections of said second filter circuit are of the series capacitor-shunt resistor type.

12. A filter circuit having an extremely flat passband and abrupt cutoff at a predetermined cutoff frequency comprising:

first and second differential amplifiers each comprising first and second transistors having base, emitter and collector electrodes;

said emitter electrodes being connected in common;

an input terminal for receiving incoming signals coupled to the base of said first transistor;

DC bias means coupled across the collectors and emitters of said amplifiers;

filter means being coupled to the collector of said first transistor of each of said amplifiers;

first and second emitter follower transistor means each having an input coupled to a respective one of said filter stages, an an output;

feedback means coupled between the base of said second transistor of each amplifier and the output of its associated emitter follower transistor means;

the base of said second amplifier first transistor being coupled to the output of said first emitter followed transistor means;

an output terminal coupled to the output of said second emitter follower transistor means for developing an output signal when at least a portion of the incoming signal falls within the passband of the filter circuit.